United States Patent [19]

Kitamura et al.

[11] Patent Number: 4,673,916

[45] Date of Patent: Jun. 16, 1987

[54] METHOD AND SYSTEM FOR DECODING A DIGITAL SIGNAL USING A VARIABLE FREQUENCY LOW-PASS FILTER

[75] Inventors: Masatsugu Kitamura, Atsugi; Mitsuaki Tanaka, Fujisawa; Hiroyuki Takekura, Sagamihara, all of Japan

[73] Assignee: Victor Company of Japan, Limited, Japan

[21] Appl. No.: 475,404

[22] Filed: Mar. 15, 1983

[30] Foreign Application Priority Data

Mar. 26, 1982 [JP] Japan .................................. 57-48255

[51] Int. Cl.$^4$ ........................................... H03K 13/02
[52] U.S. Cl. .................... 340/347 SH; 340/347 AD; 340/347 DA; 340/347 M; 324/77 R; 364/178; 364/179; 364/572; 381/31; 358/138; 307/353
[58] Field of Search ................ 340/347 SH, 347 AD, 340/347 DA, 347 CC, 347 M; 364/576, 726, 179, 178; 324/77 R, 77 A, 77 B; 363/31; 381/29-32, 51; 307/351-353

[56] References Cited

U.S. PATENT DOCUMENTS

| | | | |
|---|---|---|---|
| 3,023,277 | 2/1962 | Mathews | 370/84 |
| 3,383,461 | 5/1968 | Dryden | 358/138 |
| 3,603,773 | 9/1971 | Carlstein | 340/347 DA X |
| 4,366,471 | 12/1982 | Kasuga | 340/347 DA |
| 4,370,643 | 1/1983 | Kitamura | 340/347 SH |
| 4,393,371 | 7/1983 | Morgan-Smith | 340/347 AD |

FOREIGN PATENT DOCUMENTS 1501874 2/1978 United Kingdom .
2128049 4/1984 United Kingdom .

OTHER PUBLICATIONS

Fjallbrant, Method of Data Reduction of Sampled Speech Signals . . . , Electronics Letters, 26 May 1977, vol. 13, No. 11, pp. 334 and 335.
The Engineering Staff of Analog Devices, Inc., Analog-Digital Conversion Handbook, 6/1972, pp. I-84 to I-87.
Schmid, Electronic Analog/Digital Conversions, Van Nostrand Reinhold Co., 1970, pp. 32-37.
American Institute of Aeronautics and Astronautics, Proceedings of the 1967 National Telemetering Conference held at San Francisco, Calif., 16-17-18, May 1967, pp. 50-56, New York, US; J. W. Stumpe: "Redundancy Reduction Techniques and Applications".

Primary Examiner—T. J. Sloyan
Attorney, Agent, or Firm—Lowe, Price, LeBlanc, Becker & Shur

[57] ABSTRACT

In a data compression system, a digital signal comprising a series of digital samples and a sampling datum indicating the sampling interval of the digital samples are written into a read-write memory (M2). The digital samples and the associated sampling datum are read out of the memory into first and second digital-to-analog converters (DAC1, DAC2), respectively. The output of the first digital-to-analog converter is applied to a variable frequency low-pass filter (5) to remove the components having frequencies higher than a presettable frequency limit value which is variable as a function of the output of the second digital-to-analog converter so that the cut-off frequency is lower than one-half the sampling frequency to eliminate quantum noise.

4 Claims, 8 Drawing Figures

RECORDING MODE

FIG. 4 — PLAYBACK MODE

METHOD AND SYSTEM FOR DECODING A DIGITAL SIGNAL USING A VARIABLE FREQUENCY LOW-PASS FILTER

BACKGROUND OF THE INVENTION

The present invention relates generally to data compression techniques, and more particularly to a method and system for decoding a digital signal sampled at intervals variable inversely as a function of the instantaneous frequency of the analog signal.

Many attempts have hitherto been made to reduce the amount of information to be stored in a recording medium or transmitted over telephone lines to a distant end. A known data compression technique includes a method whereby the amplitude of analog signals is logarithmically compressed, and a method known as delta modulation in which the differential component of the analog signal is detected for transmission and the signal is integrated for recovery at the receiving end. In either of these known methods, the analog signal is sampled at a constant frequency which is at least twice the highest frequency of the analog signal to prevent foldover distortion. However, due to the constant sampling frequency quantum noise occurs in the known data compression system over the the bandwidth of the recovered signal.

According to a data compression system, as shown and described in Japanese Patent Publication (Tokkaisho) No. 56-155998, the sampling interval is determined by the amount of deviation of the original signal from the previously sampled analog value so that the deviation is smaller than a predetermined value of the ratio of the original to the sampled value. While this data compression system is satisfactory under certain circumstances, a disadvantage is that details of the original waveform are not satisfactorily recovered.

SUMMARY OF THE INVENTION

The present invention discloses a data compression system which eliminates the noise problem involved in data compression. According to this system, an analog signal is sampled at intervals inversely variable as a function of the instantaneous frequency of the original analog signal and a sampling datum representing the sampling interval is paired with the associated digital sample for recording or transmission.

The invention claimed in the appended claims is concerned with a method and system for translating into the original analog signal a digital signal comprising a series of data sets each including a sampling datum indicating a sampling interval variable inversely as a function of the instantaneous frequency of the analog signal and a series of digital samples indicating the magnitude of the analog signal.

According to the invention, during decoding or playback mode the frequency spectral components of the digital samples having frequencies higher than a presettable value are removed to derive the original analog signal. The presettable frequency value is varied as a function of the sampling datum so that the frequency range of the derived analog signal is lower than one-half the sampling frequency.

More specifically, a microcomputer is provided to store the digital signal and read out each series of digital samples and the associated sampling datum into first and second digital-to analog converters, respectively. The outputs of the first and second DA converters are applied to a variable frequency low-pass filter. The filter varies its cut-off frequency in response to the output of second DA converter and passes the components of the output of first DA converter that lie below one-half the sampling frequency to a loudspeaker, whereby the frequency range of the filter is varied according to the sampling frequency.

BRIEF DESCRIPTION OF THE DRAWINGS

The present invention will be described in further detail with reference to the accompanying drawings, in which.

DETAILED DESCRIPTION

Figure 1:
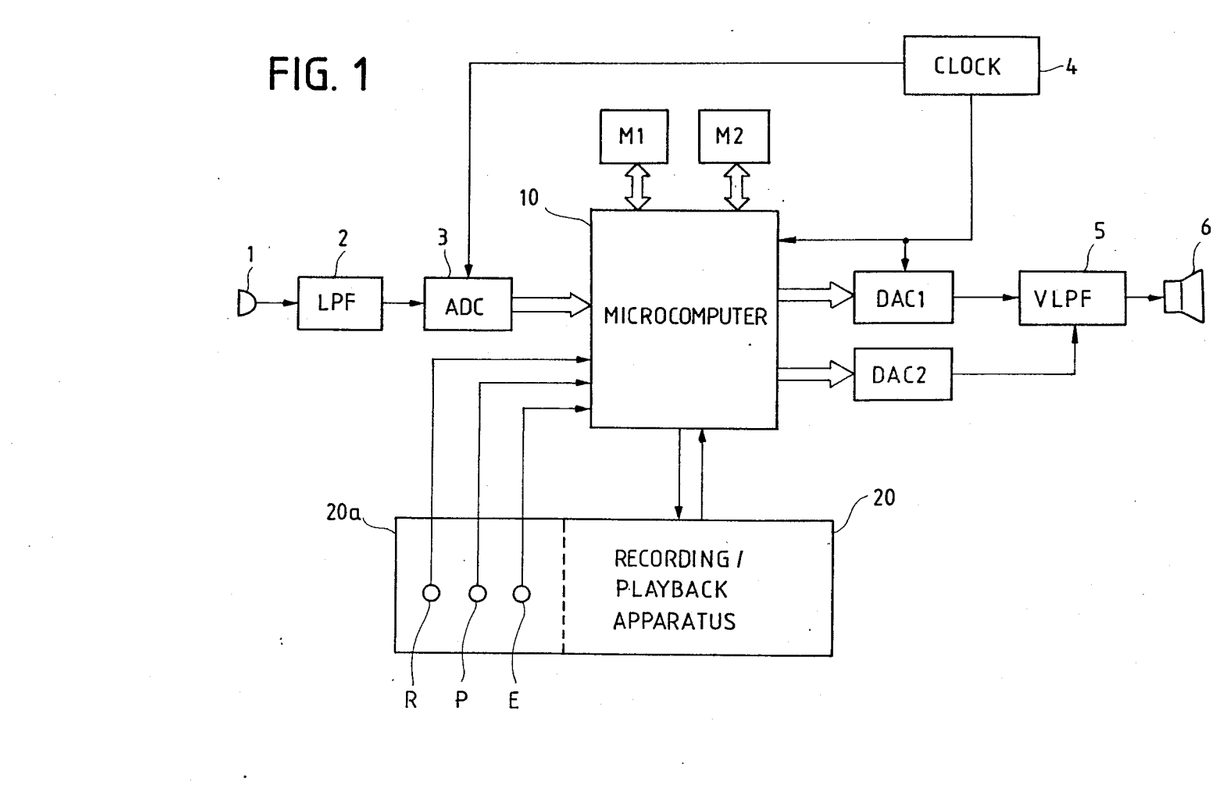
FIG. 1 is a block diagram of a data compression system according to the invention.

Referring now to FIG. 1, there is shown a data reduction system constructed according to the present invention. The data reduction system generally comprises a microcomputer 10 and a recording-playback apparatus 20. The apparatus 20 may comprise a tape recording-playback section and a control board 20a having manual controls by which command signals are fed to the microcomputer 10.

A voice signal from a microphone 1 or any other source is applied to a low-pass filter 2 where the frequencies higher than 4000 Hz are suppressed. The output of the low-pass filter 2 is fed to an analog-to-digital converter or PCM encoder 3 which is synchronized with a clock supplied from a time base 4 which forms part of the microcomputer 10. The AD converter 3 samples the signal at intervals ts which corresponds to a frequency of 8000 Hz and converts the sampled value into a digital sample of an 8-bit code. As will be detailed hereinbelow, the microcomputer 10 is programmed to receive the digitized signal at clock intervals and load it into a buffer memory M1 having a memory capacity of 512 bytes which forms part of the microcomputer and samples the stored digitized signal at longer intervals than ts determined by the programmed instructions for transfer to a read-write memory M2 to reduce the quantity of the data bits to be supplied to the recording-playback apparatus or external memory 20. The read-write memory M2 having a capacity of 64 kilobytes stores the sampled digital signals prior to further transfer to the apparatus 20.

During playback mode, digital signal from the apparatus 20 is fed to the read-write memory M2 at clock intervals and thence to digital-to-analog converters DAC1 and DAC2. The output of the DA converter DAC1 is an analog representation of the digital samples and is applied to a variable frequency low-pass filter 5. The filter 5 passes the components of the input signal which lie below a presettable cut-off frequency to a loudspeaker 6. This cut-off frequency is variable in response to the analog-converted sampling datum supplied from the output of the DA converter DAC2 so that the cut-off frequency of the filter is lower than one-half the sampling frequency (=1/ts).

The control board includes switches R, P and E. The switch R is operated to initiate recording operation, the switch P is used to initiate playback operation, and the switch E to terminate either of the recording and playback operations. When switch R is operated, clock is supplied to the AD converter 3 and the microcomputer 10 initiates the programmed instructions.

It is seen therefore that there is a substantial reduction in data quantity. The external memory system 20 may be dispensed with if the capacity of the internal memory M2 is sufficient to store the information.

Figure 2A:
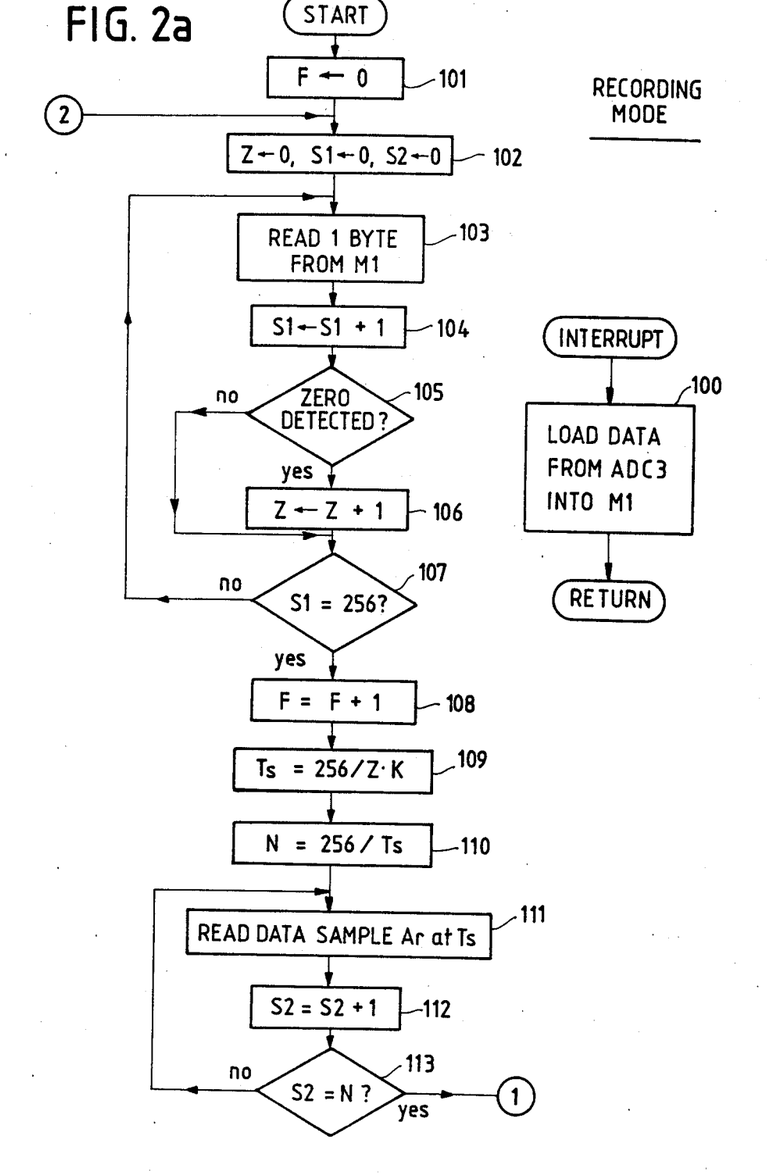
FIGS. 2a and 2b are a flowchart describing instruction steps to be executed by the microcomputer operating in a recording mode.
Figure 2B:
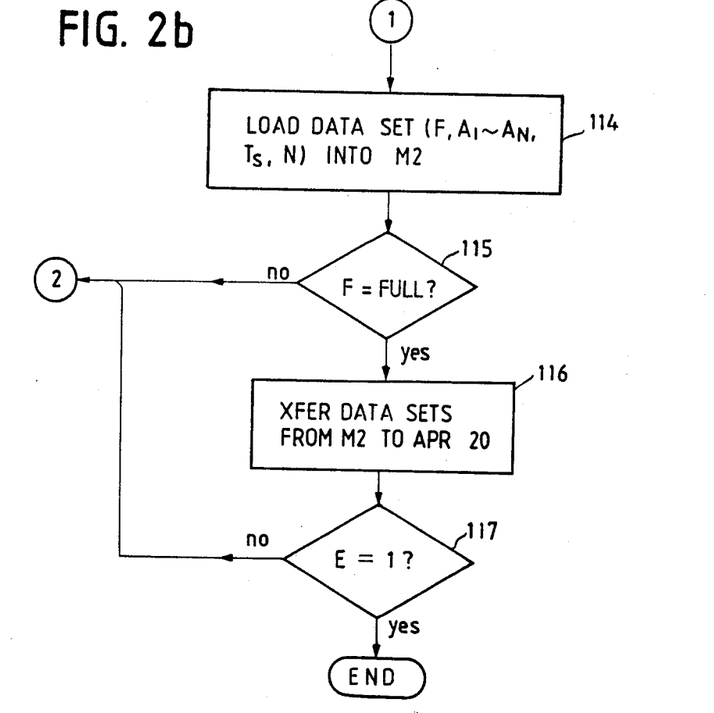

FIGS. 2a and 2b are illustrations of a flowchart describing the instructions of the microcomputer 10 programmed according to the invention which eliminates the shortcoming of the first embodiment.

When the manual switch R is operated, the program begins with a block 101 by resetting a frame counter F to zero. In block 102, the microcomputer resets other counters to zero including a zero-crossing counter Z, a 256-bit sampling counter S1 for counting the number of digital samples forming a frame to be described later, and a second sampling counter S2 for counting the number of digital samples to be transferred from the buffer memory M1 to the read-write memory M2. The zero-crossing counter Z is used to register the number of zero crossover points that occur within the frame interval. The frame counter F serves to count the number of frames that have been formed. In block 103 one byte of digital sample is loaded from the AD converter 3 into the buffer memory M1, which is followed by a block 104 to increment the sampling counter S1 by "1". A zero crossover point is detected when there is a change in sign bit of the loaded 8-bit code that signifies the occurrence of a zero crossover point of the input analog signal. This zero crossover point detection is carried out in block 105. If there is no change in the sign bit, the program tests for a completed frame and returns to block 103 to read the next digital sample and to increment the counter S1 by "1". This is repeated until a zero crossover point is detected in block 105. When this occurs, the zero-crossing counter Z is incremented by "1" in block 106 before advancing to a block 107 to check if 256 digital samples have been read from the memory M1, and if not, the program returns to block 103 again to repeat the above process until a full count (=256) is reached in the sampling counter S1, indicating completion of a frame. The frame counter F is then incremented by "1" in block 108.

Figure 3:
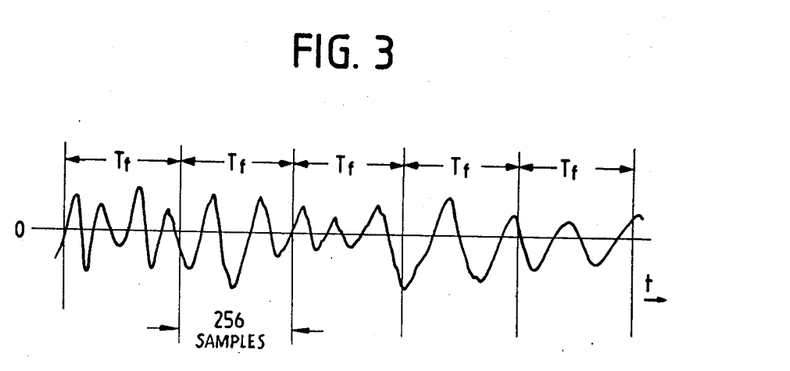
FIG. 3 is a waveform diagram useful for describing the invention.

The fact that the sampling counter S1 is filled to its full count is an index that defines a "frame" Tf as shown in FIG. 3. The count value of the zero crossing counter Z up to this moment is an indication of the number of zero crossover points of the input signal that occur in that frame interval.

According to the invention, a sampling interval Ts is determined for each frame interval for purposes of transferring N digital samples from the buffer memory M1 to the memory M2. This is done by dividing the number of sampling points (=256) by the number of detected zero crossover points Z which is multiplied by a factor K (where, K is an integer), as stated in block 109. A datum N signifying the number of digital samples to be loaded into the memory M2 is determined in block 110 by dividing 256 by Ts.

Using an address determined by Ts, the microcomputer proceeds to read a digital sample Ar (where r=1, 2, ... N) from memory M1 and the second sampling counter S2 is incremented by "1". These operations are carried out in blocks 111 and 112. In block 113, the contents of counter S2 are checked for correspondence with N, and if not, the program returns to block 111 to read the next digital sample Ar+1, further incrementing the counter S2 in block 112 until S2=N is detected in block 113, whereby digital samples $A_1$ to $A_N$ are read out of the memory M1. Digital samples $A_1$ to $A_N$ and data F, Ts and N are combined in block 114 to form a data set ($A_1$-$A_N$, F, Ts, N) and stored in the read-write memory M2. When full count is reached in the frame counter F (see block 115), the data stored in memory M2 is transferred at periodic intervals to the external memory or recording system 20, block 116. If full count is not yet reached in the counter F, the program returns to block 102 to repeat the above process in respect of the digital samples which form the next frame and enters a block 117 to check if stop switch E is operated to terminate the recording mode.

If it is assumed that K=2, Z=32 and the frame interval is 32 milliseconds, Ts will be 256/(32×2)=4 clock intervals which equals 0.5 milliseconds (=4/8000) and therefore the number of data samples of each frame is reduced from 256 to 64. If use is made of a low-pass filter having a cut-off frequency of 750 Hz, there will be no noise in the reproduced signal. If the data F, N and Ts are respectively assigned 2, 1 and 1 bytes and the average number of data samples contained in the frame interval is 64, 68 bytes of information will be required for each frame and the 64K-byte read-write memory M2 will be able to store a 30-second duration of vocal information.

Figure 4:
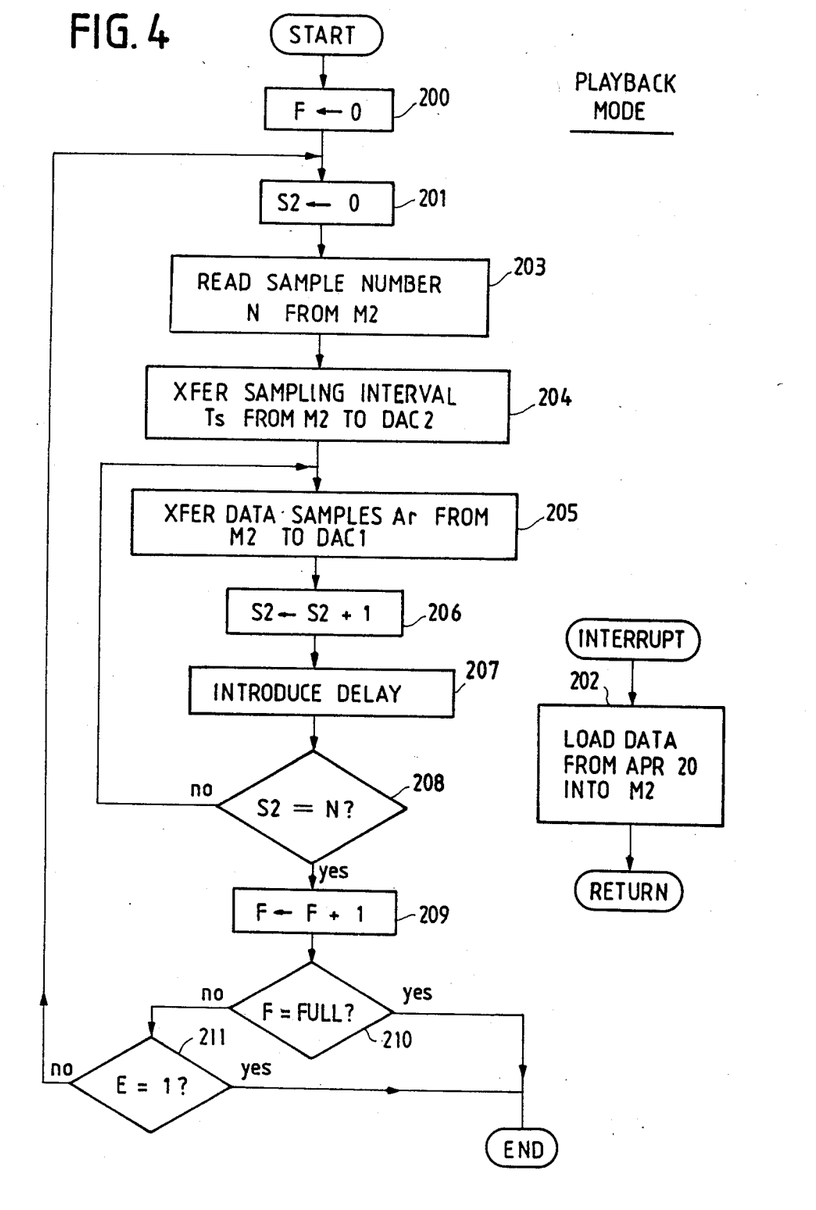
FIG. 4 is a flowchart describing instructions to be executed by the microcomputer when operating in a playback mode.

Referring to FIG. 4, playback mode is initiated in response to the operation of switch P, causing the microcomputer 10 to execute the statements in blocks 200 and 201 by resetting the frame counter F and sampling counter S2 to zero. Input data is loaded from apparatus 20 into memory M2 at clock intervals by an interrupt routine 202. The sample number datum N of a given data set is read from the memory M2 in block 203 and the sampling interval datum Ts of the data set is transferred from memory M2 to the DA converter DAC2 (block 204). A digital sample Ar of the data set is transferred from memory M2 to the DA converter DAC1 (block 205). The sampling counter S2 is incremented by "1" in block 206 after each digital sample is transferred to the DA converter DAC1. A delay time is introduced in block 207 so that the time involved in processing the blocks 205 to 208 corresponds to the sampling interval Ts. In block 208, the count value of the sampling counter S2 is checked to see if it corresponds to N, and if not, the program returns to block 205 to transfer the next digital sample Ar+1 of the given data set to converter DAC1. Therefore, digital samples $A_1$ to $A_N$ of the given data set are transferred to the converter DAC1 during each frame interval. The frame counter F is incremented by "1" in block 209. The program goes through blocks 210 and 211 and returns to block 201 to reset the sampling counter to zero to repeat the above process until the frame counter F is filled to full count or switch E is operated.

Figure 5:
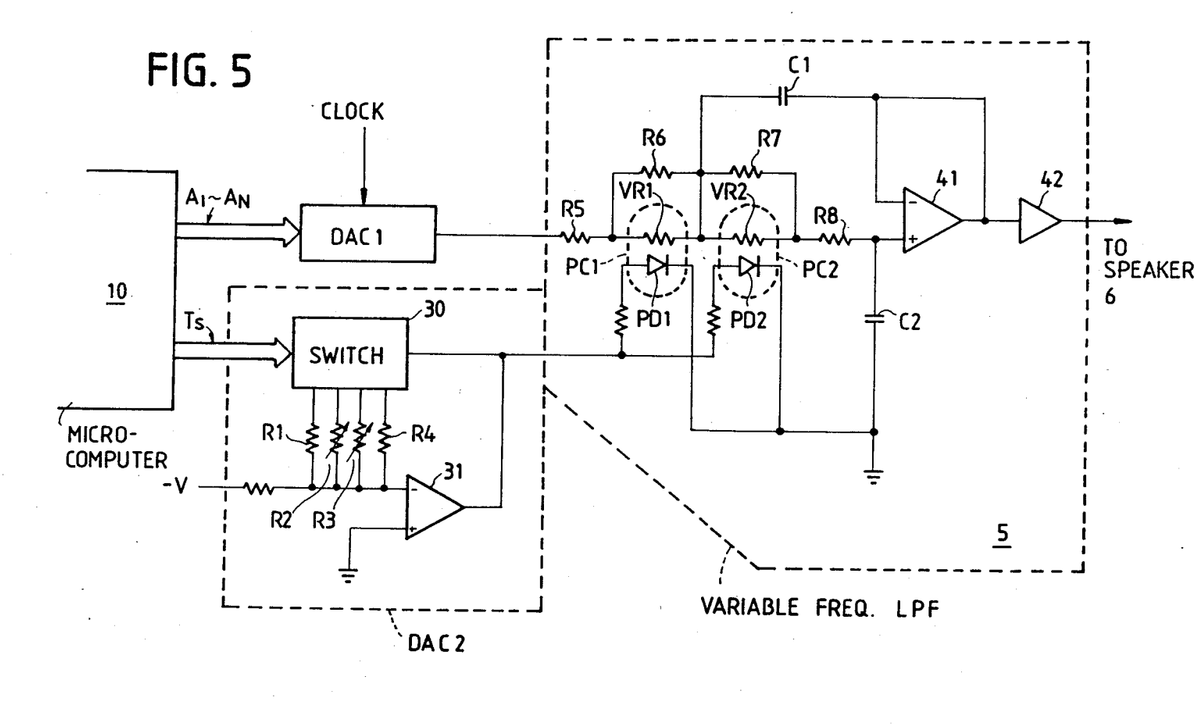
FIG. 5 is a circuit diagram of the detail of the digital-to-analog converter of FIG. 1 and a variable frequency low-pass filter of the invention.

FIG. 5 is an illustration of the detail of the DA converter DAC2 and variable frequency low-pass filter 5.

The DA converter DAC2 comprises an analog switch 30, an operational amplifier 31 and a plurality of feedback resistors R1, R2, R3 and R4. The analog switch 30 is responsive to the sampling interval data Ts to selectively couple one or more resistors between the inverting input and output terminals of the amplifier 31, so that the latter has a variable gain according to the sampling interval data. The variable frequency low-pass filter 5 comprises a pair of photocouplers PC1 and PC2 having their variable resistance elements VR1, VR2 connected in series between the output of the DA converter DAC1 and the noninverting input of an operational amplifier 41 through high-frequency determining resistors R5 and R8. The inverting input of amplifier 41 is coupled by a capacitor C1 to a junction between low-frequency determining resistors R6 and R7. A capacitor C2 is coupled between the noninverting input of amplifier 41 and ground. Capacitors C1 and C2 are also used to determine the cut-off frequencies of the low-pass filter 5. The output of amplifier 41 is amplified at 42 and fed to the loudspeaker 6. The photodiode elements PD1 and PD2 of the photocouplers are connected from the output of amplifier 31 to ground.

The resistors R2 and R3 are variable resistors which are adjusted so that the cut-off frequency of the low-pass filter 5 may correspond to the sampling interval. As a function of the digital value Ts, the amplifier 31 provides a variable impedance to the photodiodes PD1 and PD2. The variable resistors VR1 and VR2 vary their impedance values in response to the varying brightness of the photodiodes PD1, PD2 so that the following relationships are established between sampling clock interval Ts, sampling frequency fs and the cut-off frequency fc of the filter 5:

| Ts | fs (kHz) | fc (kHz) |
|----|----------|----------|
| 1  | 8        | 3        |
| 2  | 4        | 1.5      |
| 4  | 2        | 0.75     |
| 8  | 1        | 0.375    |

It is seen that the cut-off frequency of the filter 5 becomes automatically equal to a value lower than one-half the varying sampling frequency, and therefore, no quantum noise occurs in the signal applied to the loudspeaker 6.

Figure 6A:
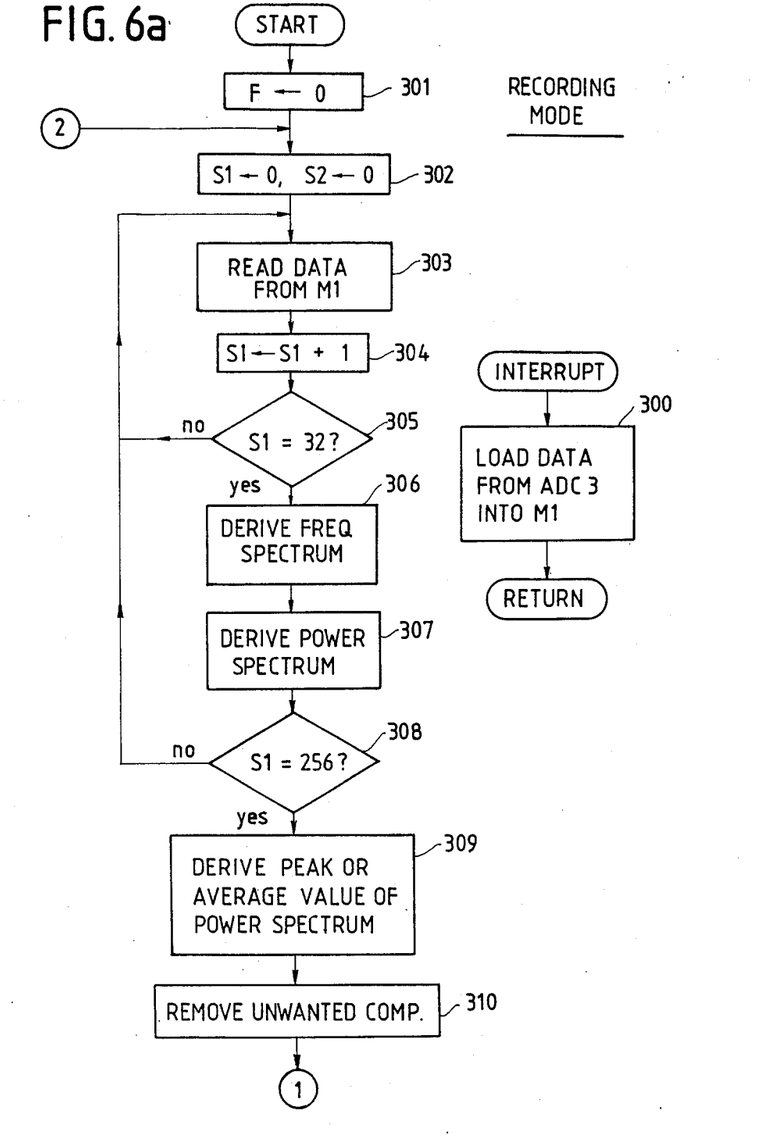
FIGS. 6a and 6b are a modified flowchart of the microcomputer.
Figure 6B:
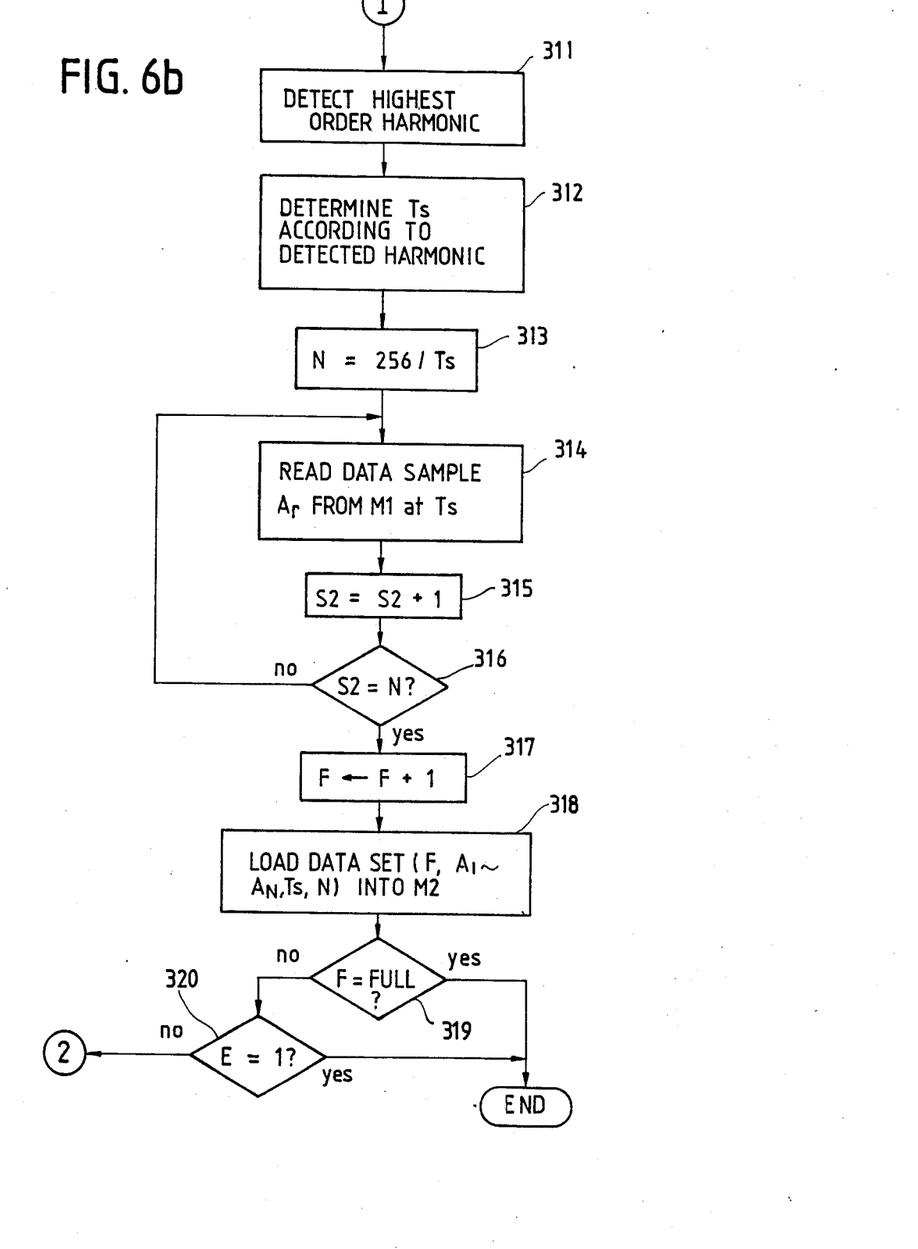

FIGS. 6a and 6b are a flowchart describing an alternative form of the recording mode. Shown at 300 is an interrupt subroutine by which digital samples are loaded from the AD converter 3 to the memory M1 at clock intervals ts. The program starts with a block 301 in which the frame counter F is reset to zero. Subsequently, the sampling counters S1 and S2 are reset to zero in block 302. A digital sample is read from the memory M1 in block 303 and the first sampling counter S1 is incremented by "1" in block 304. Blocks 305 to 309 describe steps for detecting the number of harmonic components of the digital samples that occur within a frame interval. A technique known as "Fast Fourier Transform" is used for this purpose. While this technique may be used to detect a frequency spectrum of such digital samples and to generate therefrom a power spectrum by simultaneously treating them in a single subroutine, it is preferable that the digital samples of each frame be divided into eight groups of 32 samples each and the FFT technique be applied in respect of each sample group. For this reason, a decision step is provided in block 305 to check if the counter S1 has reached a count of 32, and if so, the program is advanced to block 306 to use the FFT to derive a frequency spectrum from the group of 32 digital samples just read out of the memory M1. A power spectrum is subsequently derived in block 307 from the frequency spectrum. The blocks 303 to 307 are repeatedly executed until power spectra are derived respectively from eight groups of 32 digital samples when S1=256 is detected in a decision step in block 308.

In block 309 the microcomputer derives a peak or average value of the power spectrum from the power spectra of the individual groups and advances to block 310 to remove unwanted higher frequency components having spectral values lower than (1/64)th, for example, of the detected peak or average value. In block 311, the highest order of harmonic components of the power spectrum is detected by checking the power spectrum of which the unwanted components have been removed. This harmonic order value is used in block 312 to determine a corresponding sampling interval Ts from the following relationships:

| Highest Harmonic | Sampling Frequency (kHz) | Sampling Clock Interval Ts |
|------------------|--------------------------|----------------------------|
| 16–9             | 8                        | 1                          |
| 8–6              | 4                        | 2                          |
| 5                | 2.5                      | 3                          |
| 4                | 2                        | 4                          |
| 3                | 1.5                      | 5                          |
| 2                | 1                        | 8                          |
| 1                | 0.5                      | 16                         |

In block 313, the number of digital samples to be retrieved from the memory M1 is determined by dividing 256 by Ts and the sampling number counter N is set to 256/Ts. Digital samples $A_1$ to $A_N$ are sequentially retrieved from the memory M1 by executing a program loop including blocks 314 to 316: in block 314, a digital sample $A_r$ is read out of memory M1 and in block 315, the second sampling counter S2 is incremented by "1" and in block 316, S2=N? is checked. The frame counter F is then incremented in block 317. A data set F, $A_1$ to $A_N$, Ts and N is formed in block 318 and loaded into the memory M2. The program returns through blocks 319 and 320 to block 302 to reinitialize the sampling counters to repeat the above process.

What is claimed is:
1. A data compression method for storage and read-out of data samples comprising the steps of:
 (a) preliminarily sampling an analog signal at a predetermined frequency;
 (b) converting the preliminarily sampled signal to digital code;
 (c) storing the digitally encoded signal in a buffer memory;
 (d) selecting variable sampling intervals equal to or greater than intervals corresponding to said predetermined frequency used in said step of preliminarily sampling in accordance with an instantaneous frequency of the stored signal;
 (e) sampling signals stored in said buffer memory at said selected sampling intervals;
 (f) storing data identifying said sampling intervals of said sampling step and further including amplitude data representative of the stored signals from said buffer memory sampled in said sampling step;

(g) transferring the sampled signals including said sampling intervals and said amplitude data to a storage means;

(h) reproducing the data stored in said storage means by:

(i) feeding said amplitude data to first converting means;

(ii) feeding said sampling interval data to second converting means;

(iii) converting said amplitude data to analog form;

(iv) providing said converted analog form analog data to a variable frequency low-pass filter means;

(v) varying a cut-off frequency of said variable frequency low-pass filter means in accordance with said sampling interval data fed to said second converting means, thereby setting the cut-off frequency to be equal to or lower than one half the sampling frequency corresponding to said sampling intervals used to sample the signals stored in said buffer means, (i) outputting the signals from said variable frequency low-pass filter means, and (j) converting the sampling interval data fed to said second converting means to analog form for providing a control signal to said variable frequency low-pass filter means for varying the cutoff frequency thereof to correspond to the instantaneous frequency of the stored signal.

2. A method as recited in claim 1, wherein the step (g.i) of setting a cut-off frequency comprises selecting among several cutoff frequencies for said variable frequency low-pass filter means.

3. A method as recited in claim 1 wherein said selecting step comprises the step of determining a number of zero crossings in a predetermined time period for determining a relatively uniformly distributed subset of the signals stored in said buffer means for storage together with said sampling interval data in said storage means.

4. A data compression method for storage and readout of data samples comprising the steps of:

(a) sampling an analog signal at first sampling intervals to produce analog samples;

(b) converting the analog samples to first digital samples each having a sign bit;

(c) successively storing a predetermined number of said first digital samples in a buffer memory to form a frame;

(d) detecting a change in sign bit between successive digital samples stored in said buffer memory and providing a count representing the number of changes in sign bit detected in said frame;

(e) sampling the stored first digital samples of said frame at second sampling intervals which are equal to said predetermined number divided by a product of said count and a predetermined factor to produce second digital samples;

(f) storing and second digital samples and sampling data identifying said second sampling intervals into a storage means; and (g) deriving a replica of said analog signal from the stored second digital samples in accordance with the stored sampling data by:

(i) setting a cut-off frequency of a variable frequency low-pass filter means during said frame in accordance with said sampling data so that said cut-off frequency is equal to or lower than one half the reciprocal of said second sampling intervals;

(ii) reading the second digital samples from said storage means at said second sampling intervals and converting them to analog samples; and (iii) applying the analog samples converted from said second digital samples to said variable frequency low-pass filter means to derive said replica of the analog signal.

* * * * *